April 26, 1960 W. H. HEISER 2,934,707

MULTIAR CIRCUIT

Filed Aug. 28, 1953

INVENTOR
WILLIAM H. HEISER

BY
Ernest Fanwick
ATTORNEY

United States Patent Office 2,934,707
Patented Apr. 26, 1960

2,934,707

MULTIAR CIRCUIT

William Henry Heiser, East Paterson, N.J., assignor to International Telephone and Telegraph Corporation, Nutley, N.J., a corporation of Maryland Application August 28, 1953, Serial No. 377,139

3 Claims. (Cl. 328—146)

This invention relates to multiar circuits and, more particularly, to a diode controlled, regenerative amplitude comparator circuit of an improved multiar type.

Circuits of the conventional type depend only upon a single diode for their accuracy of amplitude comparison to provide a nearly instantaneous pulse at the instant of diode conduction. However, these conventional multiar circuits are incapable of very large percentage time modulation because of relaxation oscillations or "bouncing." This bouncing effect causes the diode control to conduct more than once during a single comparison cycle producing a false pulse output in addition to the desired pulse output. In the past it has been found necessary to drive the multiar circuit tube under abnormal conditions in order that the diode switch-off voltage be of sufficient size and speed to prevent bouncing. This known solution has not proved entirely satisfactory because of the increased circuit complexities necessitated or because the modulating source was not completely isolated from the reference voltage, thus resulting in interaction.

One of the objects of this invention is to provide an improved multiar circuit, having a high duty cycle, which permits exceptionally wide time modulation over an input sawtooth wave shape reference voltage without double triggering or abnormal tube operation.

Another object of this invention is to provide an improved multiar circuit which effectively isolates the modulating voltage source for a major portion of the duty cycle thereby reducing interaction between the reference voltage input and the modulating signal input.

One of the features of this invention is the use of a gating or blocking pulse synchronized with the time of firing of the blocking oscillator portion of the multiar circuit, which is fed back to the switching portion of the multiar circuit, thus permitting a substantially complete time swing modulation over the input reference sawtooth waveform. The period of the gating pulse is greater than the period of the input sawtooth waveform thus effectively cutting off the switching element of the multiar circuit for a longer period of time than the period of the sawtooth waveform so that if the multiar has fired at the beginning of the sawtooth waveform it will be prevented from firing again until the arrival of the next sawtooth when the gating pulse has been removed.

Figure 1:
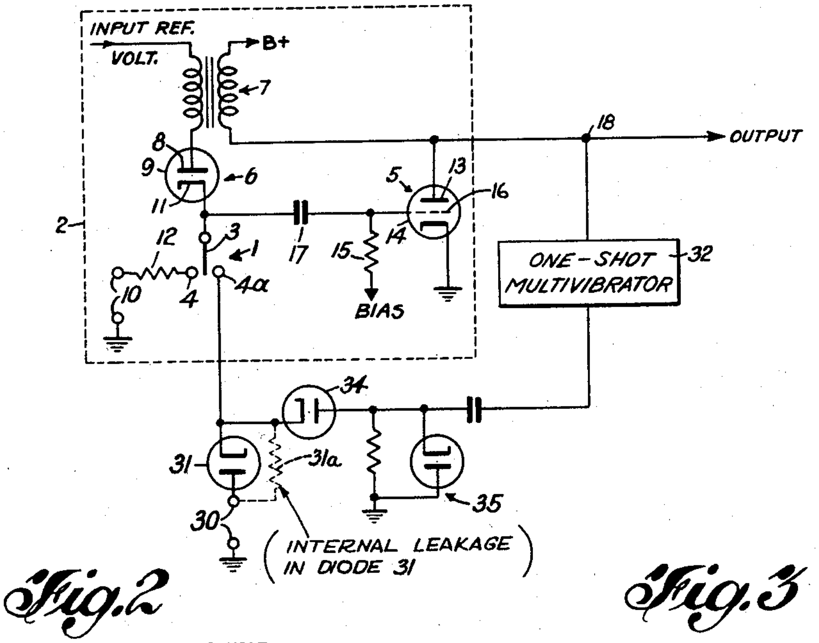
Figure 2:
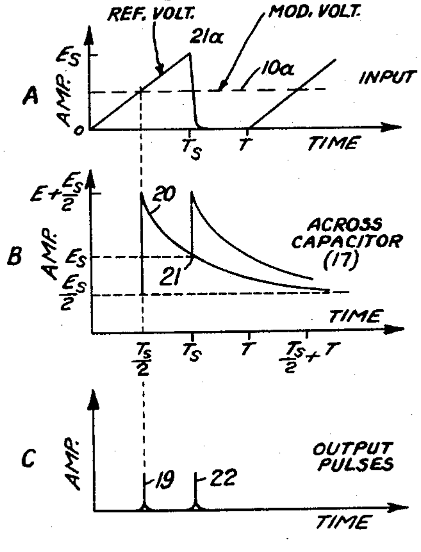
Figure 3:
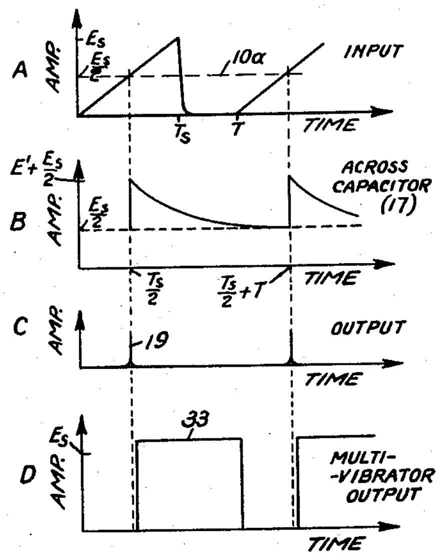

The above-mentioned and other features and objects of this invention will become more apparent by reference to the following description taken in conjunction with the accompanying drawings, in which:

Fig. 1 is a schematic illustration partly in block form of the improved multiar circuit of this invention; and Figs. 2 and 3 are graphic illustrations of waveforms helpful in the explanation of this invention.

Referring to Fig. 1 of the drawing, an improved multiar circuit in accordance with the principles of this invention is shown therein. A switch 1 is provided in the conventional multiar circuit shown within the block 2 to convert it to the improved circuit of this invention. When the armature 3 of switch 1 is coupled to contact 4, the conventional prior art multiar circuit is seen to comprise essentially a blocking oscillator portion 5 having a switching device 6 to open and close a regenerative loop. A source of reference voltage such as a sawtooth waveform shown in Fig. 2, curve A, is coupled through one winding of a coupling transformer 7 to the plate 8 of diode 9. A source of modulating voltage 10*a* whose amplitude is to be compared with the amplitude of the input reference voltage is coupled to input terminals 10 and connected to the cathode 11 of diode 9 through resistor 12 and switch 1. The combination of the input voltages determines the time of closing of diode 9. A source of biasing voltage is coupled through resistor 15 to the grid 16 of tube 14. Condenser 17 is coupled between the cathode 11 of diode 9 and the grid 16 of oscillator tube 14. When the amplitude of the input modulating voltage coupled to terminals 10 is equal to the amplitude of the input reference voltage diode 9 fires closing the loop and causing the oscillator to operate and a pulse is produced at point 18.

The bias voltage coupled through resistor 15 to the grid 16 of oscillator tube 14 is sufficient only to have oscillator tube 14 slightly conducting. The plate of the diode 9 is coupled through one winding of transformer 7 to the reference voltage input and thus assumes the voltage level of the reference voltage. The cathode 11 of diode 9 is at a higher level energy since it is at the quiescent level of the input modulating waveform coupled to terminals 10. Since cathode 11 is at a higher potential than plate 8 the diode 9 is not conducting and the feedback loop of the oscillator 5 through the transformer 7 is not complete. The reference voltage shown in Fig. 2, curve A, is seen to be a sawtooth waveform having a peak amplitude $E_s$ and a slope rise time of $T_s$. This input voltage raises the voltage level at the plate 8 of diode 9 until such period of time $T_s/2$ as the plate voltage reaches the level of the modulating voltage $E_s/2$ applied to the terminals 10 and cathode 11 of the diode 9. When the reference voltage level and the modulating voltage level are equal as shown at hime $T_s/2$, the diode 9 conducts. When the diode conducts, the feedback path of the oscillator is completed and the capacitor circuit is charged up rapidly through the diode 9 and the grid 16 of the oscillator tube 14 to a voltage E determined by the circuit impedance and tube characteristic. The voltage curve across the capacitor 17 is shown in Fig. 2, curve B. After an extremely short interval of time the diode 9 cuts off due to the biasing of condenser 17, thus the output of the oscillator 5 at point 18 will consist of a single pulse 19, Fig. 2, curve C, at the instant of time when the two input voltages are equal. When the diode 9 cuts off, the voltage across the capacitor 17 appears across the resistors 12 and 15 and starts decaying as shown by exponential curve 20, Fig. 2, curve B. As the capacitor 17 discharges, it is possible that a point can be reached such as represented at time $T_s$ when the voltage across the capacitor 17 shown by point 21, Fig. 2, curve B, is equal to the voltage $E_s$ of the input reference signal shown by point 21*a* in curve A. If this condition is met the diode 9 will reconduct causing the oscillator feedback loop to be completed and a second pulse 22, Fig. 2, curve C to be produced at the output point 18. In order to prevent this spurious response, it is necessary that the voltage level to which capacitor 17 is charged be extremely high, and this condition cannot often be met.

Referring again to Fig. 2, the voltage impressed across condenser 17 is shown in curve B and is the equivalent to the voltage at the cathode of diode 9 if resistor 12 is much larger than resistor 15. It is this voltage which prevents the diode 9 from reconducting during the remainder of the input reference voltage sawtooth waveform shown in curve A. Obviously, condenser 17 is charged to a value $E+E_s/2$ at the end of the diode 9 conduction time, and in order that the diode will not conduct at the peak 21*a* of the sawtooth waveform it is necessary that the peak magnitude $E_s$ of the sawtooth waveform be less than the voltage 21 across capacitor 17 at the time of the sawtooth peak plus the magnitude of the biasing voltage $E_s/2$ impressed across the input modulating terminals.

The most stringent case occurs when the modulating voltage impressed is equal to zero and the multiar is caused to fire at the start of the sawtooth wave ($t=0$). In order to prevent double triggering of the multiar circuit the exponential curve 20 of the discharge capacitor 17 must be at all points greater than the magnitude of the peak of the sawtooth waveform. If this condition is not met, the multiar circuit will fire when the biasing voltage is removed from the diode cathode 11 which will usually occur near the peak of the sawtooth. In other words the voltage that must be built up across the capacitor 17 during the period when the diode 9 fires is quite large and often probably impossible to obtain for some duty cycles. This large voltage besides being quite difficult to obtain presents other problems, such as feedback of the reference voltage into the modulating source, phase jitter, and excessive grid current on the oscillator tube.

The improved multiar circuit of this invention prevents spurious responses heretofore experienced in conventional multiar circuits. Switch 1, for example, has its armature 3 normally coupled to contact 4*a* which provides a feedback loop from output 18 through multivibrator 32, clamping circuit 35 and a network of diodes 31, 34. The input reference voltage is coupled through transformer 7 to oscillator 5 and switching device 6 but the input modulating voltage is now coupled to terminals 30 and thence through diode 31 to the cathode 11 of switching tube 9. The diode 31 may be a crystal diode or other type of diode having an internal leakage, such as indicated at 31*a*. The multiar circuit operates in a manner similar to the operation of the circuit heretofore explained; however, the output pulse 19 is now coupled to one-shot multivibrator circuit 32. The output voltage 33 of the multivibrator circuit 32 shown in Fig. 3, curve D, comprises a pulse in synchronism with the time of firing of the oscillator, having an amplitude greater than the peak amplitude of the input sawtooth waveform of curve A and a period which is longer than the slope rise time of the input sawtooth wave. The output pulse 33 is fed back to the diode cathode 11 through diode 34 where it is inverted. This feedback pulse effectively cuts off the diode 9 for a longer period of time than the length of the sawtooth waveform so that even if the multiar circuit has fired at the beginning of the sawtooth carrier waveform, it is prevented from firing again until the arrival of the next sawtooth when the gating or blocking pulse is removed.

Since the input modulating voltage impressed across terminals 30 only varies over the range of the sawtooth wave or less, the gating pulse from the one-shot multivibrator 32 also cuts off diode 31 isolating the modulating source impressed across terminals 30 from the multiar circuit after the initial firing until the gate waveform is removed. The discharge of the condenser 17 is now delayed until the end of the gating pulse when it is discharged through resistance 15, tube 31 by way of its internal leakage 31*a* and through the low impedance of the cathode follower (not shown) of the signal source coupled to terminals 30. The time constant for this circuit is not critical so long as it permits complete discharge of the capacitor 17 before the next firing of the circuit. Since the modified multiar circuit does not require the capacitor 17 to be charged up to a high voltage this requirement is easily met.

While I have described above the principles of my invention in connection with specific apparatus, it is to be clearly understood that this description is made only by way of example and not as a limitation to the scope of my invention as set forth in the objects thereof and in the accompany claims.

I claim:

1. A circuit for producing a pulse output when the amplitude of a reference voltage sawtooth waveform reaches the amplitude of a modulating voltage, comprising an oscillator having at least a cathode, a grid circuit and a plate circuit, a source of said reference voltage, a source of said modulating voltage, switching means coupled between said voltage sources, said switching means being adapted to conduct and cause current to flow in said plate circuit and thereby initiate operation of said oscillator when the amplitude of said reference voltage corresponds to the amplitude of said modulating voltage, means responsive to said plate current flow to bias said grid circuit and prevent further operation of said oscillator, means to produce a gating voltage of predetermined duration and magnitude in response to an output of said oscillator and a feedback circuit to couple said gating voltage to said switching means to block said switching means for the duration of said gating voltage, said feedback circuit having a diode poled to apply said gating voltage to said switching means.

2. A circuit for producing a pulse output only when the amplitude of a reference voltage sawtooth waveform, having a predetermined slope rise time and maximum peak amplitude, reaches the amplitude of a modulating voltage, comprising a blocking oscillator having at least a cathode, a grid circuit and a plate circuit, a source of said reference voltage, a source of said modulating voltage, switching means coupled between said voltage sources, said switching means being adapted to conduct and cause current to flow in said plate circuit and thereby initiate operation of said oscillator when the amplitude of said reference voltage corresponds to the amplitude of said modulating voltage, means to produce gating pulses responsive to the output of said oscillator, each of said gating pulses having a duration greater than said slope rise time and an amplitude greater than said peak amplitude, and means to couple said gating pulses to said switching means to block said switching means for the duration of said gating pulses.

3. A circuit for producing a pulse output only when the amplitude of a reference voltage having a predetermined slope rise time and maximum peak amplitude reaches an amplitude corresponding to the amplitude of a modulating voltage, comprising a blocking oscillator having at least a cathode, a grid circuit and a plate circuit, a source of said reference voltage, a source of said modulating voltage, a switching diode to which said reference voltage is applied, means to bias said switching diode in accordance with said modulating voltage to prevent said switching diode from conducting until said reference voltage reaches an amplitude corresponding to the amplitude of said modulating voltage, the conduction of said switching diode operating to cause current to flow through said plate circuit thereby initiating operation of the oscillator, means to produce gating pulses responsive to the output of said oscillator, each of said gating pulses having a duration greater than the slope rise time and the maximum peak amplitude of said reference voltage, and means to couple said gating pulses to said switching diode to block said switching diode for the duration of said gating pulses, said last named means including a diode poled to couple said gating pulses to said switching diode and means to clamp said gating pulses to a given potential level.

References Cited in the file of this patent

UNITED STATES PATENTS

| | | |
|---|---|---|
| 2,466,044 | Schoenfeld | Apr. 5, 1949 |
| 2,468,058 | Grieg | Apr. 26, 1949 |
| 2,540,923 | Williams | Feb. 6, 1951 |
| 2,605,332 | Parsons | July 29, 1952 |
| 2,726,329 | Henderson | Dec. 6, 1955 |
| 2,779,870 | Henry et al. | Jan. 29, 1957 |

OTHER REFERENCES

Waveforms, vol. 19, Radiation Laboratory Series, by Chance et al., First Edition, 1949, pages 343–345.